(12) United States Patent
Cornils et al.

(10) Patent No.: US 9,581,658 B2
(45) Date of Patent: Feb. 28, 2017

(54) HALL EFFECT SENSOR DEVICE

(71) Applicant: Micronas GmbH, Freiburg (DE)

(72) Inventors: Martin Cornils, Freiburg (DE); Christian Sander, Freiburg (DE)

(73) Assignee: Micronas GmbH, Frieburg (DE)

( * ) Notice: Subject to any disclaimer, the term of this patent is extended or adjusted under 35 U.S.C. 154(b) by 371 days.

(21) Appl. No.: 14/527,294

(22) Filed: Oct. 29, 2014

(65) Prior Publication Data
US 2015/0115950 A1 Apr. 30, 2015

(30) Foreign Application Priority Data
Oct. 29, 2013 (DE) .......................... 10 2013 018 370

(51) Int. Cl.
G01R 33/07 (2006.01)

(52) U.S. Cl.
CPC ............. *G01R 33/07* (2013.01); *G01R 33/077* (2013.01)

(58) Field of Classification Search
CPC ... B64G 1/366; G01R 33/0206; G01R 33/028; G01R 33/038; G01R 33/1215
USPC ................................. 324/251, 244
See application file for complete search history.

(56) References Cited

U.S. PATENT DOCUMENTS

| | | | |
|---|---|---|---|
| 6,750,648 B1* | 6/2004 | Tamaki | G01R 33/02 324/244 |
| 8,779,748 B2 | 7/2014 | Gotoh | |
| 8,922,207 B2 | 12/2014 | Ausserlechner | |
| 9,097,753 B2 | 8/2015 | Raz et al. | |
| 2005/0230770 A1 | 10/2005 | Oohira | |
| 2013/0015853 A1* | 1/2013 | Raz | G01R 33/07 324/251 |
| 2013/0021026 A1* | 1/2013 | Ausserlechner | G01L 1/12 324/251 |

(Continued)

FOREIGN PATENT DOCUMENTS

| | | |
|---|---|---|
| DE | 101 50 955 C1 | 6/2003 |
| DE | 10 2011 107 767 A1 | 1/2013 |

(Continued)

OTHER PUBLICATIONS

Kejik et al., "Offset Compensation Based on Distributed Hall Cell Architecture," IEEE Trans. on Magnetics, vol. 49, No. 1, pp. 105-108 (Jan. 2013).

*Primary Examiner* — Tung X Nguyen
*Assistant Examiner* — Robert P Alejnikov, Jr.
(74) *Attorney, Agent, or Firm* — Muncy, Geissler, Olds & Lowe, P.C.

(57) ABSTRACT

A hall effect sensor device implemented on a semiconductor body, having a first Hall effect sensor and a second Hall effect sensor, each of the two Hall effect sensors has at least four individual Hall effect elements and the four Hall effect elements are connected in series, and each Hall effect element has three contact terminals arranged in a row, and the series connection is implemented through a coupling or interconnection of the two outer contact terminals. Semiconductor well regions of the individual Hall effect elements are separated from one another, and the first Hall effect sensor and the second Hall effect sensor are connected in parallel, whereby a middle contact terminal of a Hall effect element of the first Hall effect sensor is connected in each case with a middle contact terminal of a Hall effect element of the second Hall effect sensor.

12 Claims, 4 Drawing Sheets

(56) References Cited

U.S. PATENT DOCUMENTS

2013/0214775 A1* 8/2013 Ausserlechner ...... H01L 43/065
                                                              324/251
2014/0327435 A1   11/2014 Röhrer

FOREIGN PATENT DOCUMENTS

| DE | 10 2011 115 566 A1 | 4/2013 |
| DE | 10 2012 221 009 A1 | 5/2013 |
| JP | 2005-259803 A | 9/2005 |
| JP | 2012-156700 A | 8/2012 |
| JP | 2013-024871 A | 2/2013 |

* cited by examiner

HALL EFFECT SENSOR DEVICE

This nonprovisional application claims priority under 35 U.S.C. §119(a) to German Patent Application No. 10 2013 018 370.7, which was filed in Germany on Oct. 29, 2013, and which is herein incorporated by reference.

BACKGROUND OF THE INVENTION

Field of the Invention

The invention relates to a Hall effect sensor device.

Description of the Background Art

A magnetic field sensor is known from DE 101 50 955 C1. The magnetic field sensor has multiple vertical Hall effect sensors, each with five contact terminals. In this design, the up to four Hall effect sensors are parallel to one another in implementation, and the contact terminals are connected to one another by means of a cyclic interchange in order to reduce the offset of the magnetic field sensor as compared to the offset of a single Hall effect sensor. In addition, the offset can be further reduced by means of the so-called "spinning current" method. It is desirable to improve the costly arrangement and the sensitivity of the magnetic field sensors.

In addition, a Hall effect sensor device with multiple individual Hall effect elements is known from DE 10 2011 107 767 A1, which corresponds to US20130015853, and which is incorporated herein by reference. Here, the individual Hall effect elements of the applicable Hall effect sensor device are connected in series in the form of a ring.

SUMMARY OF THE INVENTION

It is therefore an object of the invention to provide a device that advances the conventional art.

According to an embodiment, a Hall effect sensor device implemented on a semiconductor body is provided, having a first Hall effect sensor and a second Hall effect sensor, wherein each of the two Hall effect sensors has at least four individual Hall effect elements and the four Hall effect elements are connected in series, and wherein each Hall effect element has three contact terminals arranged in a row, and wherein the middle contact terminal is located between and directly next to the two outer contact terminals, and the series connection is implemented through a coupling or interconnection of the applicable two outer contact terminals, and wherein the start and the end of the series connection are linked together, and wherein the Hall effect elements are each implemented in a semiconductor well region of a first conductivity type, and wherein the semiconductor well regions of the individual Hall effect elements are separated from one another, and wherein the first Hall effect sensor and the second Hall effect sensor are connected in parallel in that a middle contact terminal of a Hall effect element of the first Hall effect sensor is connected in each case with a middle contact terminal of a Hall effect element of the second Hall effect sensor and a Hall contact is associated with each of the connected middle contact terminals and either a supply voltage can be applied or a Hall voltage can be picked off at the Hall contacts. It should be noted that the contact terminals of each Hall effect element that are arranged in a row preferably lie on a straight line. It is a matter of course that flat, highly doped contact regions, likewise of the first conductivity type, are formed below the contact terminals, and the semiconductor well is surrounded by an insulation region or a region of a second conductivity type. It should be noted that each of the Hall effect elements represents a functional Hall effect element in and of itself, wherein a Hall voltage can be measured at the relevant middle contact terminal.

It is an advantage of the device according to the invention that because of the inventive interconnection of individual Hall effect elements the ratio of signal to offset voltage of the Hall effect sensor device is increased by the means that the offset voltages are significantly reduced by the parallel connection of the Hall effect elements of the Hall effect sensors. The Hall effect sensors are connected in parallel with one another, and the individual offset voltages compensate one another almost entirely. It is a matter of course that the Hall effect elements of the Hall effect sensor device have an area through which current passes, wherein the normal vector of the surface is designed to be parallel to the direction of the magnetic field lines passing through the area. Furthermore, it should be noted that the Hall contacts are only associated with the middle contact terminals and none of the middle contact terminals is distinguished from any other adjacent middle contact terminal, so that a supply voltage can be applied or a Hall voltage can be picked off at each of the middle contact terminals.

In an embodiment, two of the middle contact terminals of the Hall effect elements are designed as Hall voltage pickoffs and two of the middle contact terminals of the Hall effect elements are designed as supply voltage contacts. Furthermore, the Hall effect elements preferably have an identical cross-sectional structure below the conductor track layer along the longitudinal extent of the Hall effect elements, wherein the longitudinal extent is parallel to the three contact terminals that are arranged in a row. Preferably, the contact terminals of each Hall effect element lie on a straight line.

In another embodiment, the Hall effect elements of the first Hall effect sensor and the Hall effect elements of the second Hall effect sensor have a centroidal axis or axis of symmetry located between the two Hall effect sensors, wherein two Hall effect elements of every Hall effect sensor have equal spacing from the centroidal axis or axis of symmetry. In another embodiment, all the Hall effect elements of at least one of the Hall effect sensors have equal spacing from the centroidal axis or axis of symmetry. It is further preferred for the first Hall effect sensor to have exactly the same number of Hall effect elements as the second Hall effect sensor. In this design, the Hall effect elements preferably are each implemented as vertical Hall effect elements. Moreover, it should be noted that in one embodiment each of the Hall effect sensors has more than four Hall effect elements and preferably all of the Hall effect sensors have the same number of Hall effect elements.

In an embodiment, only the middle contact terminals are connected to one another between the first Hall effect sensor and the second Hall effect sensor in each case, which is to say that the outer contacts of each Hall effect sensor are only connected to one another within the relevant Hall effect sensor so that a closed ring of the elements connected in a series circuit is produced by connecting the relevant outer contacts.

In an embodiment, an integrated circuit is additionally implemented on the semiconductor body of the Hall effect sensor device, wherein the integrated circuit preferably stands in operative electrical connection with the Hall effect sensors, which is to say in the present case with the first Hall effect sensor and the second Hall effect sensor. The integrated circuit can be designed both to apply the supply voltages to selected first middle contacts and to pick off and evaluate a Hall voltage at selected second contacts at the same time.

In addition, a third Hall effect sensor and a fourth Hall effect sensor can be implemented on the semiconductor body and all four Hall effect sensors can stand in operative electrical connection with one another; in particular, the middle contact terminals of the Hall effect sensors are connected to one another. It should be noted here that the term operative connection can be understood among other things to mean, for example, an electrical connection between the integrated circuit and the Hall effect sensor or Hall effect sensors. Furthermore, it is advantageous for the semiconductor body to be located in a single, common housing with the Hall effect sensors and/or the integrated circuit. It should be noted that the integrated circuit preferably comprises a multiplexer circuit in order to apply a supply voltage to the first two selected middle contacts in a first switching state of the multiplexer circuit while the Hall voltage present at the second two selected middle contacts is picked off. In a second switching state of the multiplexer circuit, a supply voltage is applied to the second two selected middle contacts while the Hall voltage present at the first two selected middle contacts is picked off. In particular, with the multiplexer unit a so-called "spinning current" method can be performed in order to further reduce the offset voltages of the Hall effect sensor device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
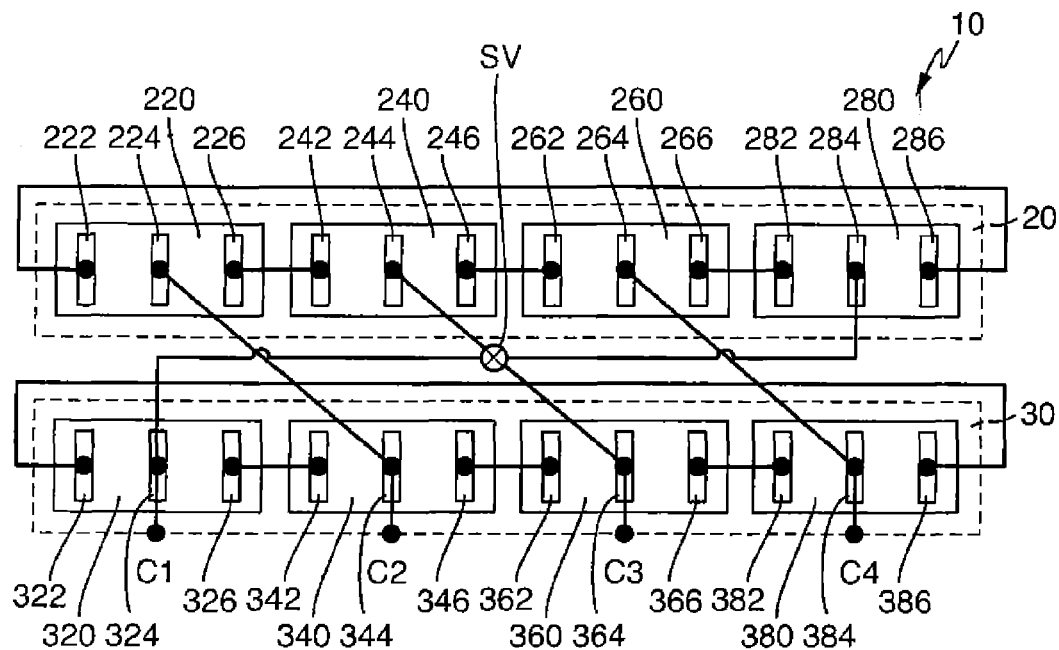
FIG. 1 shows a schematic top view of an embodiment according to the invention of a Hall effect sensor device with precisely two Hall effect sensors that each have four Hall effect elements in a first diagonal interconnection configuration.

The illustration in FIG. 1 shows a schematic top view of an embodiment according to the invention of a Hall effect sensor device 10 with a first Hall effect sensor 20 and a second Hall effect sensor 30 in a first interconnection configuration.

The first Hall effect sensor 20 has a first Hall effect element 220, a second Hall effect element 240, a third Hall effect element 260, and a fourth Hall effect element 280, wherein the first Hall effect element 220 has a first outer contact terminal 222 and a second middle contact terminal 224 and a third outer contact terminal 226, i.e., the second contact terminal 224 is immediately adjacent to the first contact terminal 222 and the third contact terminal 226. In addition, the second Hall effect element 240 has a first outer contact terminal 242 and a second middle contact terminal 244 and a third outer contact terminal 246, i.e., the second contact terminal 244 is immediately adjacent to the first contact terminal 242 and the third contact terminal 246.

In addition, the third Hall effect element 260 has a first outer contact terminal 262 and a second middle contact terminal 264 and a third outer contact terminal 266, i.e., the second contact terminal 264 is immediately adjacent to the first contact terminal 262 and the third contact terminal 266. Lastly, the fourth Hall effect element 280 has a first outer contact terminal 282 and a second middle contact terminal 284 and a third outer contact terminal 286, i.e., the second contact terminal 284 is immediately adjacent to the first contact terminal 282 and the third contact terminal 286.

The four Hall effect elements 220, 240, 260, and 280 of the first Hall effect sensor 20 are connected to one another in a closed ring-like series circuit. Here, the third contact terminal 226 of the first Hall effect element 220 is connected to the first contact terminal 242 of the second Hall effect element 240, and the third contact terminal 246 of the second Hall effect element 240 is connected to the first contact terminal 262 of the third Hall effect element 260, and the third contact terminal 266 of the third Hall effect element 260 is connected to the first contact terminal 282 of the fourth Hall effect element 280, and the third contact terminal 286 of the fourth Hall effect element 280 is connected to the first contact terminal 222 of the first Hall effect element 220.

In addition, the second contact terminal 224 of the first Hall effect element 220 is implemented as a second Hall contact C2, and the second contact terminal 244 of the second Hall effect element is implemented as a third Hall contact C3, and the second contact terminal 264 of the third Hall effect element 260 is implemented as a fourth Hall contact C4, and the second contact terminal 284 of the fourth Hall effect element 280 is implemented as a first Hall contact C1 of the first Hall effect sensor 20.

The second Hall effect sensor 30 has a first Hall effect element 320, a second Hall effect element 340, a third Hall effect element 360, and a fourth Hall effect element 380, wherein the first Hall effect element 320 has a first outer contact terminal 322 and a second middle contact terminal 324 and a third outer contact terminal 326, i.e., the second contact terminal 324 is immediately adjacent to the first outer contact terminal 322 and the third outer contact terminal 326. In addition, the second Hall effect element 340 has a first outer contact terminal 342 and a second middle contact terminal 344 and a third outer contact terminal 346, i.e., the second contact terminal 344 is immediately adjacent to the first contact terminal 342 and the third contact terminal 346.

In addition, the third Hall effect element 360 of the second Hall effect sensor 30 has a first outer contact terminal 362 and a second middle contact terminal 364 and a third outer contact terminal 366, i.e., the second contact terminal 364 is immediately adjacent to the first contact terminal 362 and the third contact terminal 366. Lastly, the fourth Hall effect element 380 has a first outer contact terminal 382 and a second middle contact terminal 384 and a third outer contact terminal 386, i.e., the second contact terminal 384 is immediately adjacent to the first outer contact terminal 382 and the third outer contact terminal 386.

The four Hall effect elements 320, 340, 360, and 380 of the second Hall effect sensor 30 are connected to one another in a closed ring-like series circuit. Here, the third contact terminal 326 of the first Hall effect element 320 is connected to the first contact terminal 342 of the second Hall effect element 340, and the third contact terminal 346 of the second Hall effect element 340 is connected to the first contact terminal 362 of the third Hall effect element 360, and the third contact terminal 366 of the third Hall effect element 360 is connected to the first contact terminal 382 of the fourth Hall effect element 380, and the third contact terminal 386 of the fourth Hall effect element 380 is connected to the first contact terminal 322 of the first Hall effect element 320.

In addition, the second contact terminal 324 of the first Hall effect element 320 is connected to the first Hall contact C1, and the second contact terminal 344 of the second Hall effect element is connected to the second Hall contact C2, and the second contact terminal 364 of the third Hall effect element 360 is connected to the third Hall contact C3, and the second contact terminal 384 of the fourth Hall effect element 380 is connected to the fourth Hall contact Hall contact C4.

In addition, the second contact terminal 224 of the first Hall effect element 220 of the first Hall effect sensor 20 is connected to the second contact terminal 344 of the second Hall effect element 340 of the second Hall effect sensor 30, and the second contact terminal 244 of the second Hall effect element 240 of the first Hall effect sensor 20 is connected to the third contact terminal 366 of the third Hall effect element 360 of the second Hall effect sensor 30, and the second contact terminal 264 of the third Hall effect element 260 of the first Hall effect sensor 20 is connected to the second contact terminal 384 of the fourth Hall effect element 380 of the second Hall effect sensor 30, and the second contact terminal 284 of the fourth Hall effect element 280 of the first Hall effect sensor 20 is connected to the second contact terminal 324 of the first Hall effect element 320 of the second Hall effect sensor 30. A symmetry axis SV is formed between the two Hall effect sensors.

Furthermore, each of the Hall effect elements 220, 240, 260, 280, 320, 340, 360, and 380 is implemented as a vertical Hall effect element in its own semiconductor well region, not shown, of a first conductivity type, wherein the semiconductor well regions of the individual Hall effect elements 220, 240, 260, 280, 320, 340, 360, and 380 are separated from one another by an isolation region. In advantageous manner, the first conductivity type is implemented as n-doping.

Because the middle contact terminals 224, 244, 264, and 284 of the first Hall effect sensor 20 are connected in pairs to the middle contact terminals 324, 344, 364, and 384 of the second Hall effect sensor 30, and in particular are each connected to a Hall contact C1 or C2 or C3 or C4, the first Hall effect sensor 20 is connected in parallel to the second Hall effect sensor 30.

It is an advantage that the offset voltage can be significantly reduced through the parallel connection of multiple Hall effect sensors 20 and 30. It is a matter of course that two of the Hall contacts C1, C2, C3, and C4 are implemented as supply voltage connections, i.e. have a supply voltage applied to them, and that a Hall voltage can be picked off at the two remaining Hall contacts C1, C2, C3, and C4. In this design a multiplicity of different circuit variants can be implemented; in other words, the supply voltage can be present at different contacts C1, C2, C3, and C4, and the Hall voltage can correspondingly be picked off at the other Hall contacts C1, C2, C3, and C4.

Figure 2:
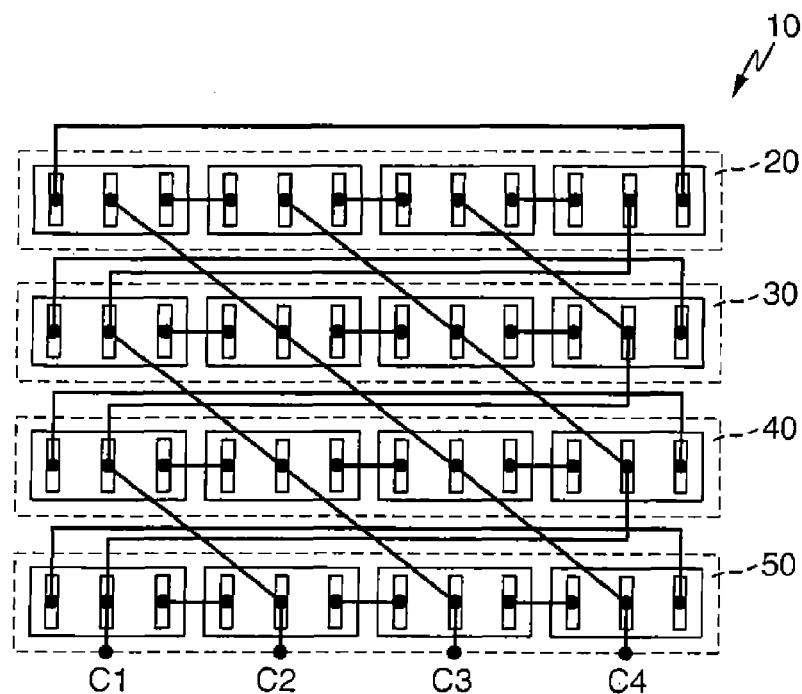
FIG. 2 shows a schematic top view of an embodiment according to the invention of a Hall effect sensor device with precisely four Hall effect sensors that each have four Hall effect elements in the first diagonal interconnection configuration.

The illustration in FIG. 2 shows another embodiment according to the invention of a Hall effect sensor device 10 having multiple Hall effect sensors, each with four Hall effect elements, in the first diagonal interconnection configuration. In the following, only the differences from the first embodiment are explained. For reasons of clarity, the detailed referencing of the individual Hall effect elements shown in the illustration in FIG. 1 is not presented, nor is the referencing carried further. Now, a third Hall effect sensor 40 and a fourth Hall effect sensor 50 are connected to the first Hall effect sensor 20 and the second Hall effect sensor 30 by the means that the middle contact terminals of the individual Hall effect elements are once again connected to one another. In this case, the diagonal interconnection of the middle contact terminals of the two Hall effect sensors 20 and 30 from the embodiment from FIG. 1 is carried further, which is to say that for the third Hall effect sensor 40 and the fourth Hall effect sensor 50, the middle contacts of Hall effect sensors 20, 30, 40, and 50 are also connected together with Hall effect sensors 20, 30, 40, and 50 in the diagonal interconnection configuration. In this way, exactly four middle contact terminals of four Hall effect elements of the four Hall effect sensors 20, 30, 40, and 50 are connected to each of the Hall contacts C1 to C4.

Figure 3:
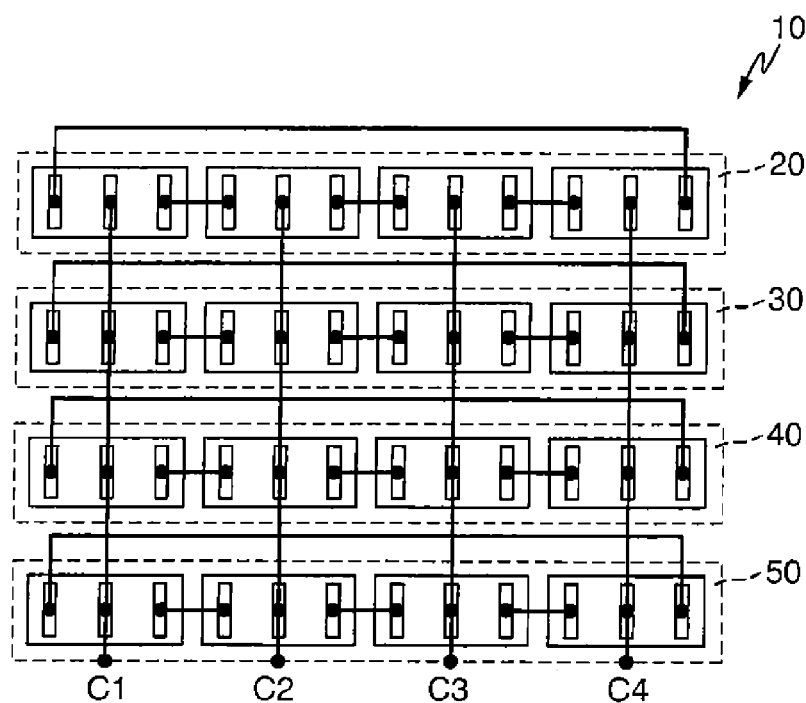
FIG. 3 shows a schematic top view of an embodiment according to the invention of a Hall effect sensor device with precisely four Hall effect sensors that each have four Hall effect elements in a second interconnection configuration.

The illustration in FIG. 3 shows another embodiment according to the invention of a Hall effect sensor device 10 having four Hall effect sensors 20, 30, 40, and 50, and having four Hall effect elements for each Hall effect sensor 20, 30, 40, and 50 in a second straight interconnection configuration. In the following, only the differences from the embodiment shown in the illustration in FIG. 2 are explained. The relevant first middle contact terminals of the four Hall effect sensors 20, 30, 40, and 50 are connected to one another and to the first Hall contact C1, and the relevant second middle contact terminals of the four Hall effect sensors 20, 30, 40, and 50 are connected to one another and to the second Hall contact C2, and the relevant third middle contact terminals of the four Hall effect sensors 20, 30, 40, and 50 are connected to one another and to the third Hall contact C3, and the relevant fourth middle contact terminals of the four Hall effect sensors 20, 30, 40, and 50 are connected to one another and to the fourth Hall contact C4.

Figure 4:
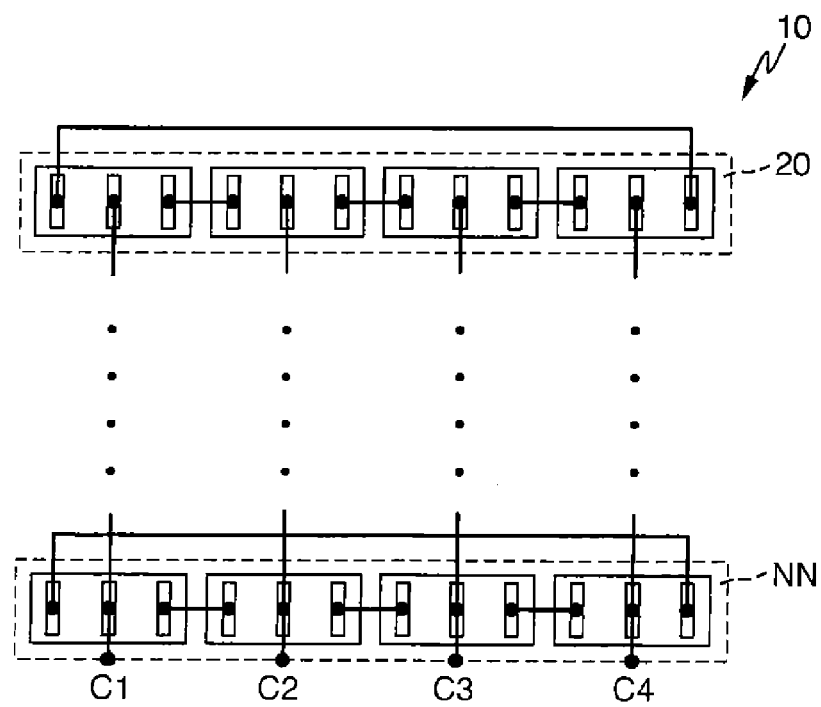
FIG. 4 shows a schematic top view of an embodiment according to the invention of a Hall effect sensor device with more than four Hall effect sensors, wherein each Hall effect sensor has precisely four Hall effect elements in the second interconnection configuration.

The illustration in FIG. 4 shows another embodiment according to the invention of a Hall effect sensor device 10 having a number of the Hall effect sensors 20, 30, 40, and 50 that is greater than four and having four Hall effect elements per Hall effect sensor 20, 30, 40, and 50 in a second straight interconnection configuration. In the following, only the differences from the embodiment shown in the illustration in FIG. 3 are explained. Now, in addition to the four Hall effect sensors 20, 30, 40, and 50, a number of Hall effect sensors up to a number NN is connected in parallel in the second straight interconnection configuration. The number NN of Hall effect sensors is preferably greater than five, most preferably greater than ten. It is a matter of course that the number of parallel-connected Hall effect sensors can also be connected in the first diagonal interconnection configuration as an alternative to the second straight interconnection configuration.

Figure 5:
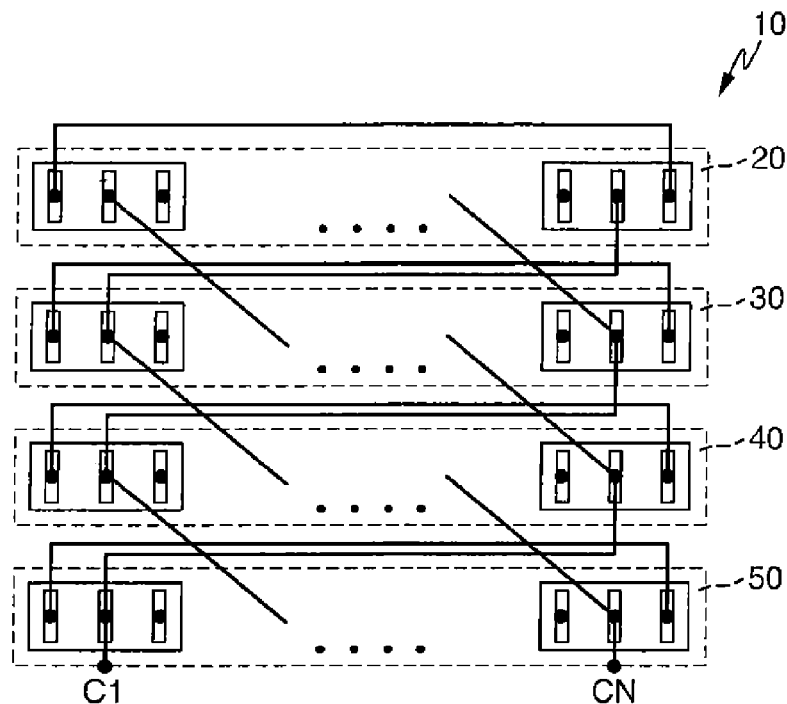
FIG. 5 shows a schematic top view of an embodiment according to the invention of a Hall effect sensor device with four Hall effect sensors, wherein each Hall effect sensor has more than four Hall effect elements in the first interconnection configuration.

The illustration in FIG. 5 shows another embodiment according to the invention of a Hall effect sensor device 10 having four Hall effect sensors 20, 30, 40, and 50 but having more than four Hall effect elements for each Hall effect sensor 20, 30, 40, and 50, in the first diagonal interconnection configuration. In the following, only the differences from the embodiment shown in conjunction with the illustration in FIG. 2 are explained. Now, in addition to the four Hall effect elements, each of the Hall effect sensors 20, 30, 40, and 50 has a number of additional Hall effect elements. In accordance with the additional number of Hall effect elements, the number of Hall contacts is also increased to a number N. In the present case, the Hall effect sensors 20, 30, 40, and 50 are connected in parallel in the first diagonal interconnection configuration and to the relevant Hall contacts C1 to CN. The number of Hall contacts per Hall effect sensor 20, 30, 40, and 50 of the Hall effect elements connected in the aforesaid series connection, is preferably greater than five, most preferably greater than ten Hall effect elements. It is a matter of course that the number of parallel-connected Hall effect sensors can also be connected in the second straight interconnection configuration as an alternative to the first diagonal interconnection configuration.

Figure 6:
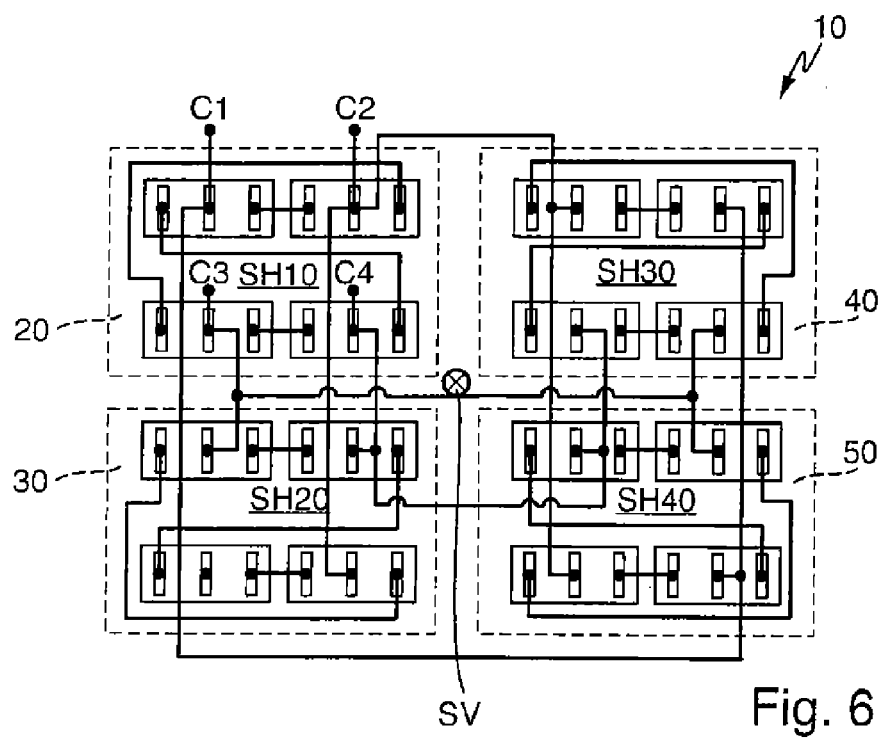
FIG. 6 shows a schematic top view of an embodiment according to the invention of a Hall effect sensor device with precisely four Hall effect sensors that each have four Hall effect elements in the first interconnection configuration, but with a first grouped arrangement of the Hall effect elements.

The illustration in FIG. 6 shows another embodiment according to the invention of a Hall effect sensor device 10 having four Hall effect elements for each Hall effect sensor 20, 30, 40, and 50, in a third grouped interconnection configuration. In the following, only the differences from the embodiment shown in the illustration in FIG. 3 are explained. The relevant Hall effect sensor 20, 30, 40, and 50 is divided into two rows located one below the other, wherein each Hall effect sensor 20, 30, 40, and 50 is implemented in one of the four rectangles illustrated. Furthermore, each Hall effect sensor 20, 30, 40, and 50 has a centroidal axis SH10, SH20, SH30, and SH40 located in the center of the relevant Hall effect sensor 20, 30, 40, and 50. Each of the sensor centroidal axes SH10, SH20, SH30, and SH40 has equal spacing from a common centroidal axis or symmetry axis SV of the Hall effect sensor device 10. In accordance with the grouped arrangement of the individual Hall effect sensors 20, 30, 40, and 50, the Hall contacts C1, C2, C3, and C4 are also grouped in two rows located one below the other. It is a matter of course that the Hall effect sensors 20, 30, 40, and 50 are connected to one another in such a way that the Hall effect sensors 20, 30, 40, and 50 are each connected in parallel with respect to the Hall contacts C1, C2, C3, and 04, and that each of the four Hall effect elements of the Hall effect sensors 20, 30, 40, and 50 connected to one of the Hall contacts C1, C2, C3, and C4 has equal spacing from the symmetry axis SV.

Figure 7:
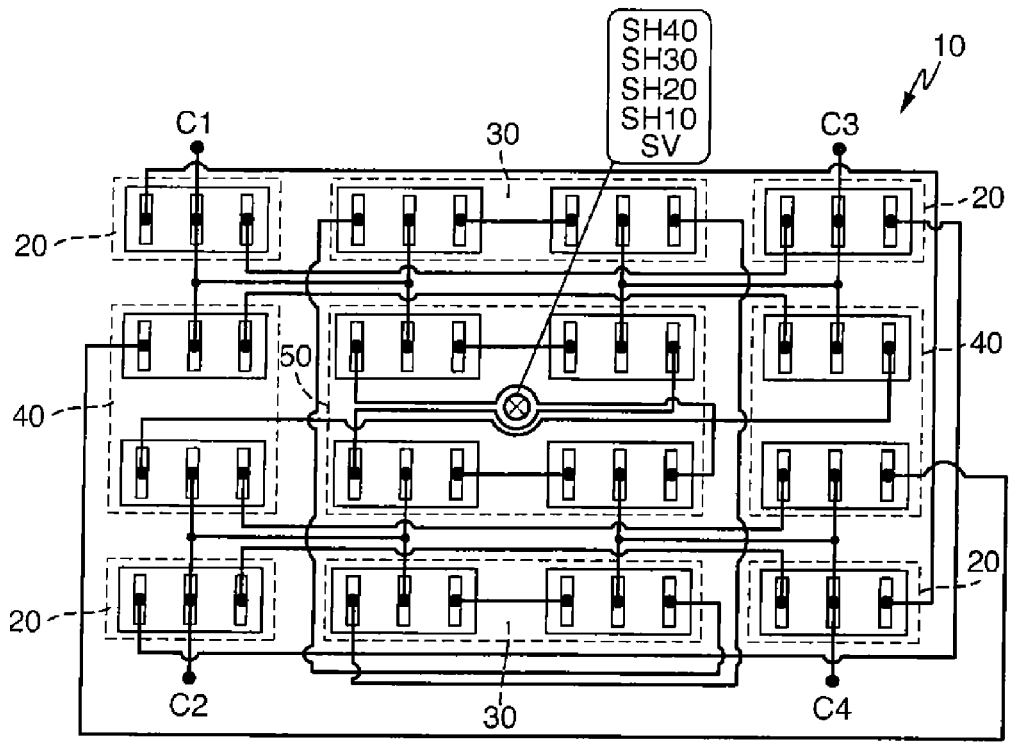
FIG. 7 shows a schematic top view of an embodiment according to the invention of a Hall effect sensor device with precisely four Hall effect sensors that each have four Hall effect elements in the first interconnection configuration, but with a second grouped arrangement of the Hall effect elements.

The illustration in FIG. 7 shows another embodiment according to the invention of a Hall effect sensor device 10 having four Hall effect elements for each Hall effect sensor 20, 30, 40, and 50, in a fourth, subdivided interconnection configuration. The Hall effect sensor device forms a rectangle. In the following, only the differences from the embodiment shown in the illustration in FIG. 6 are explained. In each of the Hall effect sensors 20, 30, 40, and 50, one of the four Hall effect elements of every Hall effect sensor 20, 30, 40, and 50 is located in one quadrant of the rectangle. It is a matter of course that the four Hall effect elements of every Hall effect sensor 20, 30, 40, and 50 are connected in the aforesaid series connection despite the distributed arrangement. In this design, the individual Hall effect elements of every Hall effect sensor 20, 30, 40, and 50 are distributed such that each of the four Hall effect elements has equal spacing from the symmetry axis SV of the Hall effect sensor device 10 with respect to the common centroidal axis or symmetry axis SV. Furthermore, it is always the case that two Hall effect elements of the relevant Hall effect sensor 20, 30, 40, and 50 are arranged with mirror-image symmetry to one another with respect to the symmetry axis SV and have equal spacing from the symmetry axis SV. Furthermore, the individual sensor centroidal axes SH10, SH20, SH30, and SH40 coincide with the symmetry axis SV. In contrast to FIG. 6, the middle contact terminals of the Hall effect elements within each quadrant of the rectangle are connected to one another and each of them is also connected to one of the four Hall contacts C1, C2, C3, and C4.

It is an advantage of the distribution of the Hall effect elements that the effect of a static divergence of the magnetic flux density in the vicinity of the Hall effect sensor device 10 is strongly suppressed. The offset voltage of the Hall effect sensor device 10 can be further reduced in this way.

It should be noted that, in contrast to the embodiments of the Hall effect elements shown, the Hall effect elements can also have an arrangement of the contact terminals offset with respect to one another, differing from an arrangement of the contact terminals located on a straight line. As a result, the contact terminals of the Hall effect sensors 20, 30, 40, and 50 are no longer arranged on a straight line. Nonetheless, the individual Hall effect elements have an identical structural layout such that the implementations of each of the Hall effect elements are indistinguishable from one another in a cross section below the conductor track layer along the row-like arrangement of the contact terminals. The individual Hall effect elements can also be implemented rotated relative to one another, in a departure from the present arrangement where the applicable straight lines of contact terminals are parallel to one another, so that the straight lines passing through the rows of contact terminals also have an angle relative to one another, i.e., the Hall effect elements are not oriented in the same direction to one another. Investigations have shown that the magnitude of the offset voltage does not depend on this.

Figure 8A:
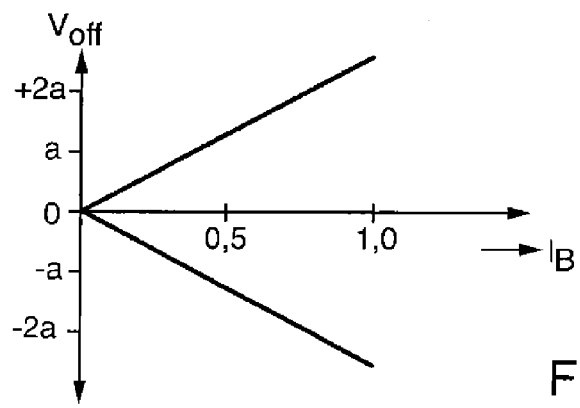
FIG. 8a shows a plot of the single-phase offset voltage as a function of the operating current of the Hall effect sensor.

The illustration in FIG. 8a plots the offset voltages VOFF as a function of the magnitude of the operating current IB of the Hall effect sensor device 10. In this regard, FIG. 8a shows the behavior of the offset voltage VOFF according to the use of the Hall contacts C1, C2, C3, and C4 in accordance with the spinning current method. For both curves of VOFF, it is the case that the magnitude of the offset voltage VOFF takes on larger values with increasing amplitude of the operating current IB and crosses the axis sections a or −a.

Figure 8B:
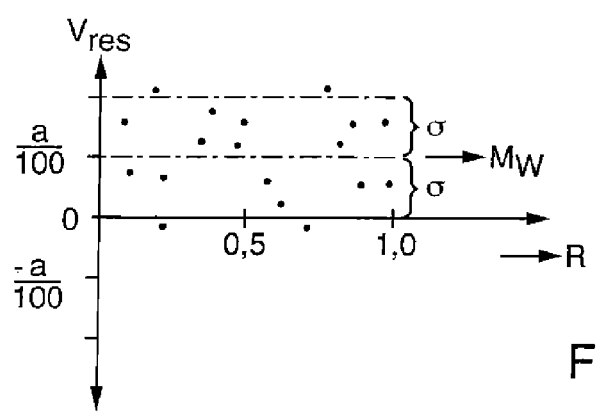
FIG. 8b shows a plot of the remaining offset voltage after application of the "spinning current" method as a function of the number of measured devices according to the invention.

In addition, FIG. 8b shows the residual offset Vres after execution of the spinning current method for a number of Hall effect sensor devices 10 implemented on a wafer. The residual offset voltages Vres are plotted along the Y axis, while the measured Hall effect sensor devices 10 are plotted along the X axis. According to the illustration in FIG. 8b, each point represents the measured offset voltage of one of the Hall effect sensor devices. It should be noted that in contrast to the illustration in FIG. 8a, the scaling of the X axis is shown magnified by a factor of 100 so to be able to show an offset voltage at all. Accordingly, the offset voltages can be reduced to an extremely great degree with the Hall effect sensor device according to the invention, and hence the measurement range can be extended greatly to low magnetic field intensities. Stated differently, the Hall effect sensor device has an increased dynamic range.

Furthermore, it is evident that the dispersion of the offset voltages between the Hall effect sensor devices is very small. Consequently, a number of measurements of the offset voltages of different Hall effect sensor devices produces the result that the standard deviations δ and −δ are very small indeed, which is to say that in over 90% of the measured Hall effect sensor devices the measured offset voltage VOFF is very close to the mean value MW.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A Hall effect sensor device implemented on a semiconductor body, the Hall effect sensor device comprising:
   a first Hall effect sensor; and
   a second Hall effect sensor, the first and second Hall effect sensor each having at least four individual Hall effect elements connected in series, each of the at least four individual Hall effect elements having three contact terminals arranged in a row,
   wherein a middle contact terminal is arranged between and directly next to the two outer contact terminals,
   wherein the series connection of the at least four individual Hall effect elements is implemented through an interconnection of the two outer contact terminals of each individual Hall effect element,
   wherein a start and an end of the series connection are linked together,
   wherein the Hall effect elements are each implemented in a semiconductor well region of a first conductivity type,
   wherein the semiconductor well regions of the individual Hall effect elements are separated from one another, and
   wherein the first Hall effect sensor and the second Hall effect sensor are connected in parallel in that a middle contact terminal of a Hall effect element of the first Hall effect sensor is connected in each case with a middle contact terminal of a Hall effect element of the second Hall effect sensor and a Hall contact is associated with each of the connected middle contact terminals and either a supply voltage can be applied or a Hall voltage can be picked off at the Hall contacts.

2. The Hall effect sensor device according to claim 1, wherein two of the middle contact terminals of the Hall effect elements are designed as Hall voltage pickoffs and two of the middle contact terminals of the Hall effect elements are designed as supply voltage contacts.

3. The Hall effect sensor device according to claim 1, wherein the Hall effect elements have an identical cross-sectional structure along the longitudinal extent of the Hall effect elements, wherein the longitudinal extent is parallel to the three contact terminals that are arranged in a row.

4. The Hall effect sensor device according to claim 1, wherein the Hall effect elements of the first Hall effect sensor and the Hall effect elements of the second Hall effect sensor have an axis of symmetry located between the two Hall effect sensors, and wherein two of the Hall effect elements of every Hall effect sensor have equal spacing from the axis of symmetry.

5. The Hall effect sensor device according to claim 1, wherein the first Hall effect sensor has exactly the same number of Hall effect elements as the second Hall effect sensor.

6. The Hall effect sensor device according to claim 1, wherein only the middle contact terminals are connected to one another between the first Hall effect sensor and the second Hall effect sensor in each case.

7. The Hall effect sensor device according to claim 1, wherein the Hall effect elements are each implemented as vertical Hall effect elements.

8. The Hall effect sensor device according to claim 1, wherein an integrated circuit is implemented on the semiconductor body, and the integrated circuit is in electrical connection with the first Hall effect sensor and the second Hall effect sensor.

9. The Hall effect sensor device according to claim 1, wherein each Hall effect sensor has more than four Hall effect elements.

10. The Hall effect sensor device according to claim 1, wherein all Hall effect elements of at least one of the Hall effect sensors have equal spacing from the axis of symmetry.

11. The Hall effect sensor device according to claim 1, wherein a third Hall effect sensor and a fourth Hall effect sensor are implemented on the semiconductor body, and wherein the four Hall effect sensors are electrical connection with one another.

12. The Hall effect sensor device according to claim 1, wherein the semiconductor body is located in a single, common housing with the Hall effect sensors.

* * * * *